United States Patent [19]

Glaser et al.

[11] Patent Number: 5,606,510
[45] Date of Patent: *Feb. 25, 1997

[54] HIGH SPEED POWER ANALYZER

[75] Inventors: R. Steven Glaser; Jeffrey M. Bade, both of Midland, Mich.

[73] Assignee: The Dow Chemical Company, Midland, Mich.

[*] Notice: The portion of the term of this patent subsequent to Mar. 30, 2010, has been disclaimed.

[21] Appl. No.: 362,471

[22] PCT Filed: Aug. 3, 1992

[86] PCT No.: PCT/US92/06439

§ 371 Date: Dec. 21, 1994

§ 102(e) Date: Dec. 21, 1994

[87] PCT Pub. No.: WO94/03818

PCT Pub. Date: Feb. 17, 1994

[51] Int. Cl.[6] .................................................. G01R 21/00
[52] U.S. Cl. .................... 364/483; 364/484; 364/550; 364/492; 324/76.19; 324/76.21; 324/76.22

[58] Field of Search ...................................... 364/483, 484, 364/492, 550; 324/76.19, 76.21, 76.22

[56] References Cited

U.S. PATENT DOCUMENTS 5,151,866 9/1992 Glaser et al. ........................ 364/483

*Primary Examiner*—Emanuel T. Voeltz
*Assistant Examiner*—Hien Vo
*Attorney, Agent, or Firm*—Dale H. Schultz; William J. Coughlin

[57] ABSTRACT

A method and apparatus for rapidly and continuously sampling AC voltage and current signals in a power system. The sampled signals are then analyzed in a sine board computer to derive a number of fundamental electrical variables. These variables include frequency, RMS volts, RMS amps and a phase angular relationship between the voltage and currents in the system. The computer also performs calibration and compensation functions. From these fundamental variable, other useful parameters can be calculated such as watts, watt-hours, VARS, and power factor.

29 Claims, 11 Drawing Sheets

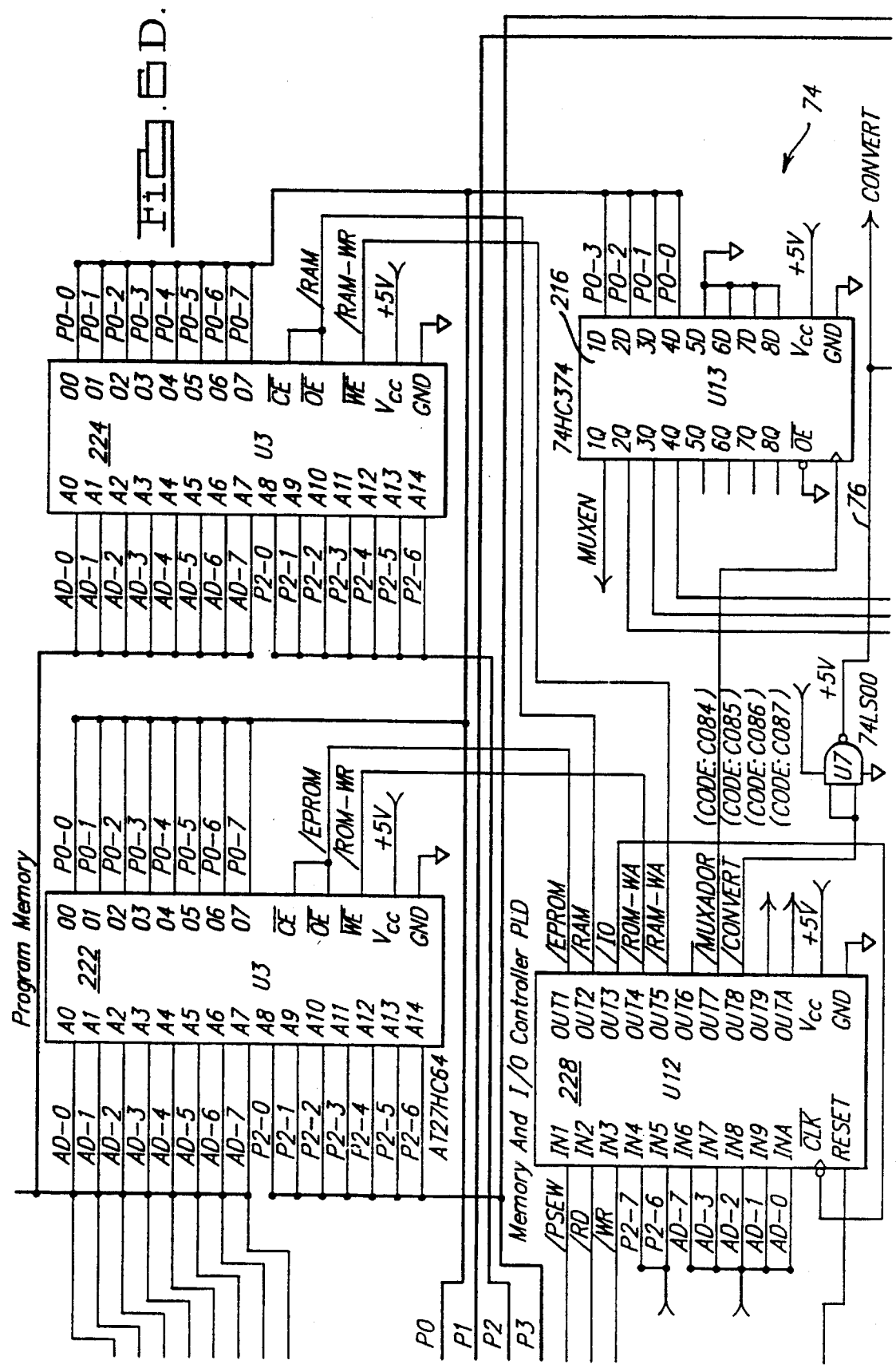

HIGH SPEED POWER ANALYZER

BACKGROUND AND SUMMARY OF THE INVENTION

The present invention relates generally to systems for monitoring electrical power circuits and particularly to a programmable system for measuring and calculating electrical parameters from multiple power circuits.

The monitoring of electrical power is important to ensure that this energy resource is effectively generated, distributed and utilized. Utilities need to measure power coming out of a generation station or going into a power station. In addition, to minimize power transmission losses, it is important to minimize the phase relationship between the current and voltage waveforms of the power being transmitted. In industrial control applications, it is important to be able to continuously monitor the current and phase of the power into a machine which may vary with the machine load.

Traditional systems for monitoring power circuits require the installation of individual measuring devices to measure a specific power system parameter; for example, Watts, Vars, Amps, or Volts. These devices typically comprise discrete analog transducers which convert AC voltage and current signals from a power system into DC output signals proportional to the true power on the system. For example, typical utility revenue kilowatt hour meters measure power in an analog fashion. Where a data acquisition system must measure numerous circuits, requiring separate measuring devices for each circuit can add greatly to the overall cost of the system. Also, where a number of circuits are being remotely monitored for computer processing and display, the individual devices must be connected to a data acquisition device and suitably processed to interface with the computer. Further, multiple measuring devices greatly increase the overall error of the system.

Accordingly, it is a principle objective of the present invention to provide a simplified system for measuring various parameters in multiple power circuits to reduce the cost of purchasing, installing and maintaining the system.

More specifically, it is an objective of the present invention to provide a system in which a single measuring device measures the fundamental parameters in a power system so that subsequent derived parameters can be computed in a controller data processing computer, thereby eliminating the necessity of multiple measuring devices.

It is another objective of the present invention to provide a power analyzer which reduces the cost of maintenance of the overall system.

It is an additional objective of the present invention to provide a power analyzer which has very high precision through self calibration and a non-synchronous measurement technique.

It is still another objective of the present invention to provide a microprocessor controlled power analyzer that can continuously and rapidly monitor a plurality of circuits.

To achieve these foregoing objectives, the present invention provides a high speed power analyzer which utilizes voltage and current input devices, such as transformers, for transmitting signals proportional to the voltage and current levels in the circuits being measured. The signals are transmitted to a multiplexer and the output of the multiplexer is coupled to an analog to digital (A to D) converter for converting the voltage and current signals a digital representation of same. A digital processor circuit is coupled to the multiplexer for selecting which inputs are coupled to the multiplexer outputs. The processor circuit also is coupled to the A to D converter to receive the digital voltage and current signals. The processor circuit continuously samples and stores the voltage and current signals at regular intervals of time and also calculates and stores a plurality of electrical variables related to the power used by the circuits. For example, these electrical variables may include frequency, RMS volts, RMS amps, and the phase angular relationship between the voltage and the currents in the system.

In one form of the present invention, the system includes a host computer coupled to the digital processor circuit for performing additional calculations on the electrical variables to thereby derive electrical parameters relating to the performance of the power circuits. These parameters may include Watts, Watt-hours, Vars, Power Factor, etc.

Another feature of the present invention, is that the software of the processor circuit performs continuous functions such as calibration, drift and offset compensation and zero cross detection. In addition, the system samples the input devices rapidly and continuously in a manner which is not synchronized to the power waveforms being sampled. Specifically, in one form of the present invention, the system samples five channels at a rate of 1199 times each second.

Additional advantages and features of the present invention will become apparent from a reading of the detailed description of the preferred embodiment which makes reference to the following set of drawings.

BRIEF DESCRIPTION OF THE DRAWINGS

FIGS. 6A–6F comprise schematic diagrams for the circuits contained in the sine board computer shown in FIG. 1.

DETAILED DESCRIPTION OF THE PREFERRED EMBODIMENTS

Figure 1:
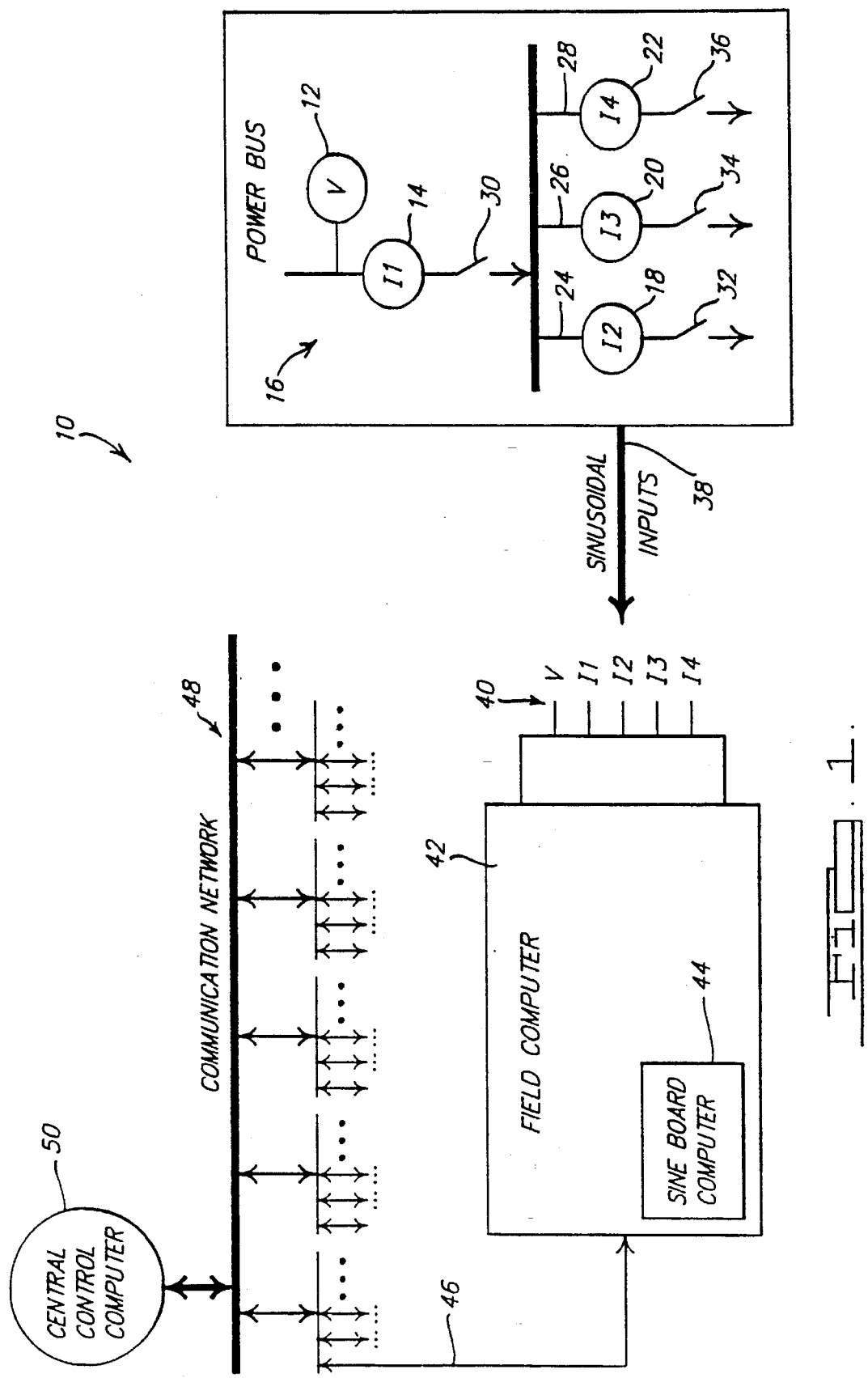
FIG. 1 is a diagram of the overall power analyzer system in accordance with the present invention.

Referring to FIG. 1, a block diagram of a high speed power analyzer system 10 according to the present invention is shown. The power analyzer system 10 utilizes a voltage transformer 12 and a current transformer 14 for sensing voltage and current at the input of a power bus 16 at one phase of a power substation. It will be appreciated that in general there will be three phases in each power substation, however, for simplicity only one phase is shown. Additional current transformers 18, 20 and 22 sense the current flowing through circuits 24, 26 and 28 respectively which each lead to final load devices (not shown). Conventional circuit breakers 30, 32, 34 and 36 are employed for circuit protection. Sinusoidally varying signals from the potential transformer 12 and the current transformers 14, 18, 20 and 22, are transmitted along the input bus 38 to the five input channels 40 of a field or host computer 42. The host computer 42 comprises generally a host processor which communicates with at least one sine board computer 44 and other input/ output devices.

It will be appreciated that a passive resistor divider circuit (not shown) is preferably connected to the potential transformer 12. Thus, the signal reaching the field computer 42 is a reduced signal proportional to the bus 16 voltage. That is, V sensed=K×V bus; where K is proportional to the resistance of the resistor divider circuit. In addition, a shunt resistor (not shown) is installed with the current transformers 14, 18, 20, 22. The shunt is selected to develop 0.707 VRMS at a 6 Amps current transformer loop current. Again, the voltage measured across the shunt resistor is proportional to the current flowing in the current transformer loop. That is, V sensed=K2×V shunt; where K2 is proportional to the resistance of the shunt resistor. Also, V shunt=R shunt×I current transformer loop.

Figure 2:
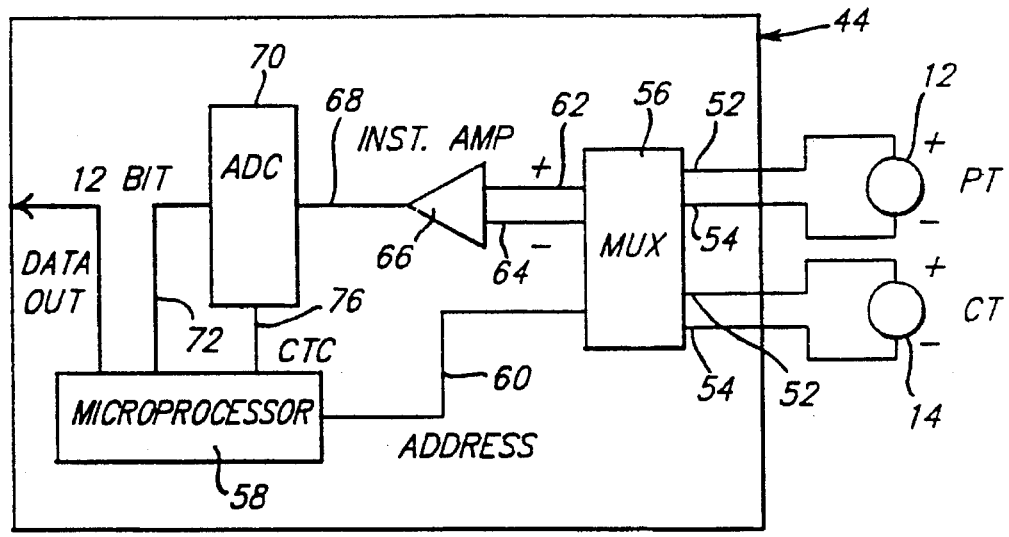
FIG. 2 is a block diagram of the major components of the sine board computer shown in FIG. 1.

In general, the sine board computer 44 samples the voltage input and each current input to compute the RMS voltage and RMS currents. Next, the sine board computer 44 measures the phase relationship between the voltage and each of the currents. The sine board computer 44 samples each input channel 1199 times each second and determines all zero crossing points for each input signal. The precise time base of a microprocessor in the sine board computer 44 is used to measure the time difference between zero crossings to calculate the phase relationships. This information is then transmitted to the field computer 42 where it is transmitted along bus 46 to a communication network 48 that is coupled to a central control computer 50. Referring now to FIG. 2, the sine board computer 44 is shown in more detail. The potential transformer 12 and one of the current transformers 14 is depicted, each having plus and minus inputs 52 and 54 entering the sine board computer 44 where they are coupled to a multiplex device 56. While only one current transformer 44 is shown in FIG. 2 for simplicity, it will be appreciated that the other current transformers 18, 20 and 22 are likewise connected to the multiplexer 56 inputs. Multiplexer 56 may comprise, for example, a type 507A multiplex circuit manufactured by Harris Corp.

A microprocessor 58, such as an 80C31, manufactured by Intel Corp., with its associated circuitry is coupled to the multiplexer 56 along line 60 for permitting the microprocessor 58 to select which of the inputs to the multiplexer 56 are directed to the multiplexer output lines 62 and 64. Under control of the microprocessor 58, the signal from either the potential transformer 12 or any of the current transformers 14, 18, 20 and 22 may be directed to the multiplex output lines 62 and 64. The multiplex output 62, 64 is directed to a differential amplifier circuit 66 which takes the difference between the multiplex outputs 62 and 64, amplifies this difference signal by ten and transmits it along output line 68. An A to D converter 70, which may be, for example, an AD578 manufactured by Analog Devices Inc., accepts the amplified difference signal along line 68 as its input and converts this sinusoidally varying analog signal to a 12 bit digital signal. The digitized 12 bit signal is then transmitted along bus 72 to the microprocessor 58. The microprocessor 58 is also connected to the A to D converter 70 through its associated circuitry 74 (shown in FIG. 6D), which provides a command to convert (CTC) line 76 which is used to initiate the conversion sequence after settling.

Figure 4A:
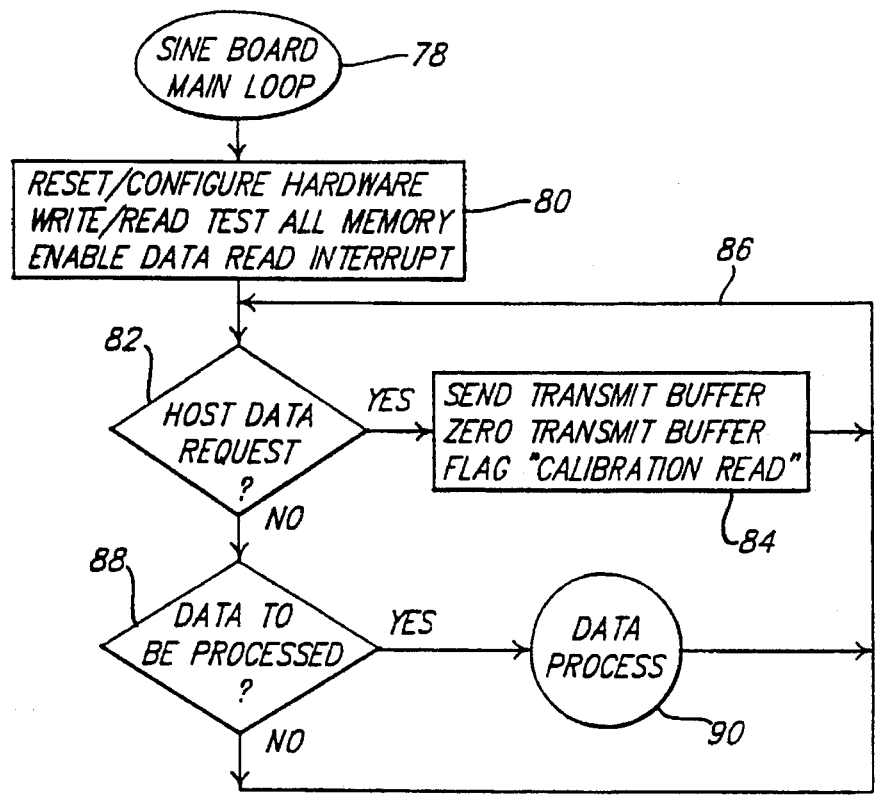
FIGS. 4A–4E comprise flowcharts for the processing performed by the sine board computer in accordance with the present invention.

Referring now to FIGS. 4A–4E, the primary software processing steps of the sine board 44 are depicted. FIG. 4A is a flowchart of the sine board 44 main loop as performed by the microprocessor 58. In particular, sine board main loop 78 initially resets and reconfigures the hardware as required in step 80. In addition, in step 80 the microprocessor 58 will read/write test all memory. Finally, in step 80 the data read interrupt is enabled. The data read interrupt is the means by which the microprocessor 58 samples data from the potential transformer 12 and current transformers 14, 18, 20 and 22. This sampling occurs 1199 times per second (i.e., at fixed 834 microsecond intervals) for each of the five input channels 40. That is, the data read interrupt takes a total of 1199×5 samples per second. Further details of the data read interrupt will be discussed below in connection with FIG. 4B. The sine board process 78 also determines whether there has been a host data request in decision diamond 82. In other words, between interrupts the processor checks to see if the host computer 42 has requested a data update. Such requests will generally occur once per second and are described in more detail below in connection with FIG. 5A.

If there is a host data request, the processor proceeds to step 84 where the data in a transmit buffer is sent to the host 42. Also a "calibration read" flag is set. The process then proceeds along line 86 back to decision diamond 82. If there is no host data request, the process then proceeds to decision diamond 88 where it is determined whether there is data to be processed. Thus, when an interrupt has been performed and data has been read, there will be data from one or more samples to be processed, in which case the data process sub-routine 90 will process the data read during the interrupt. The data processing sub-routine will be described below in connection with 4C. If decision diamond 88 determines that there is no data to be processed, the process proceeds along line 86 back to decision diamond 82. It will be appreciated that the data processing sub-routine 90 will be performed once per data read interrupt.

Figure 4B:
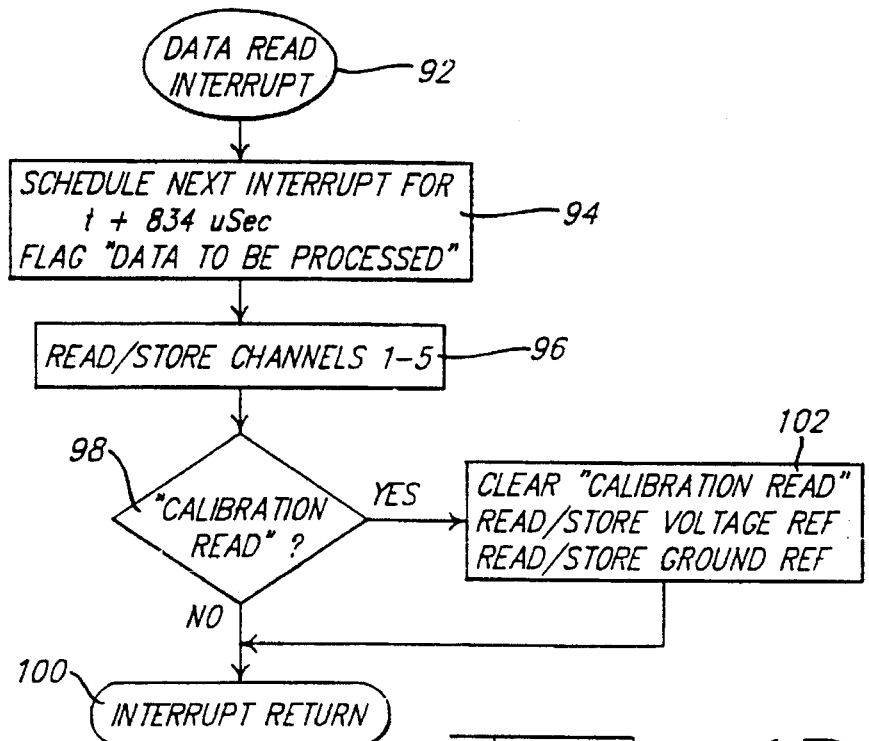
Figure 6A:
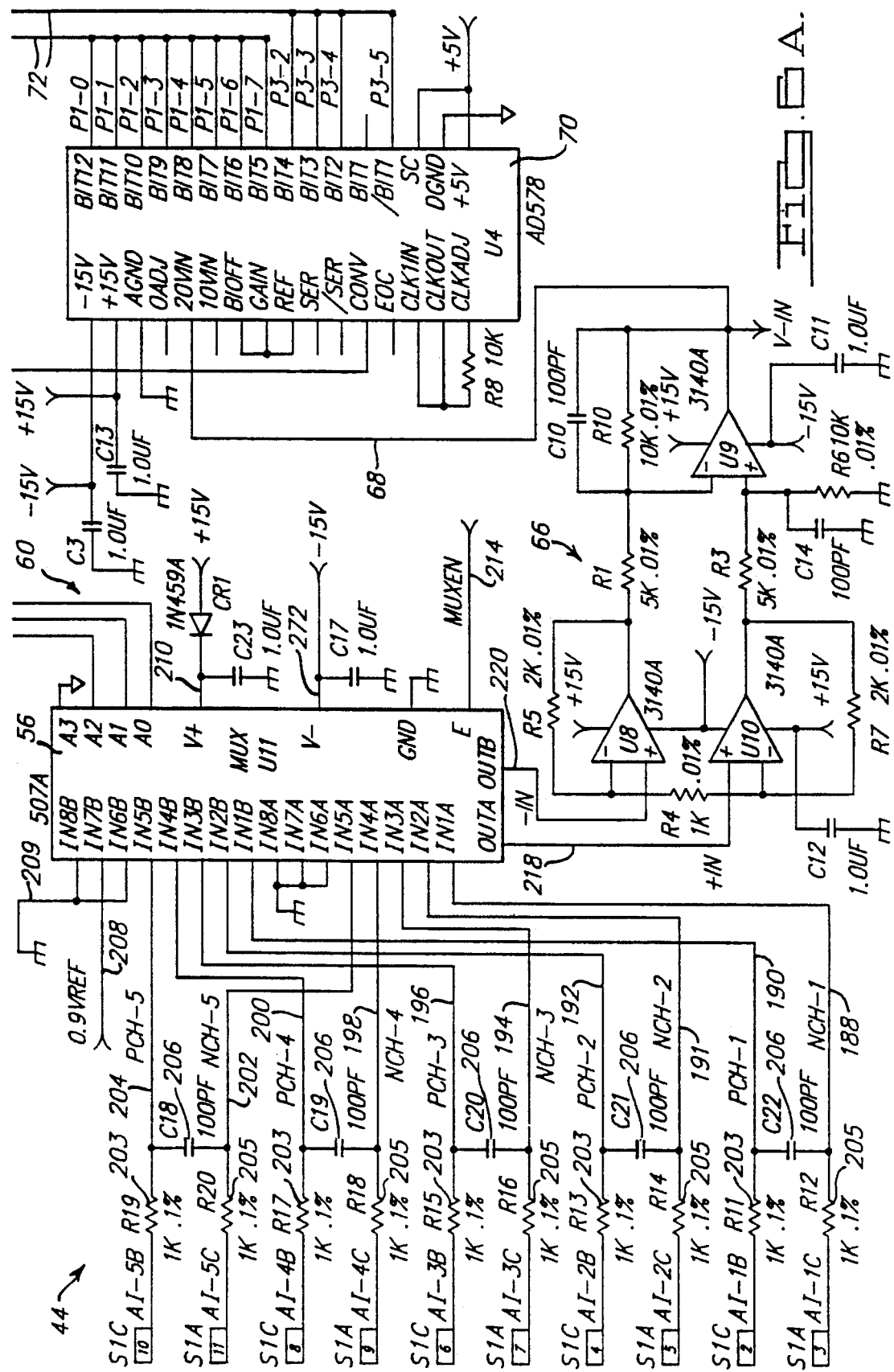
Figure 8B:
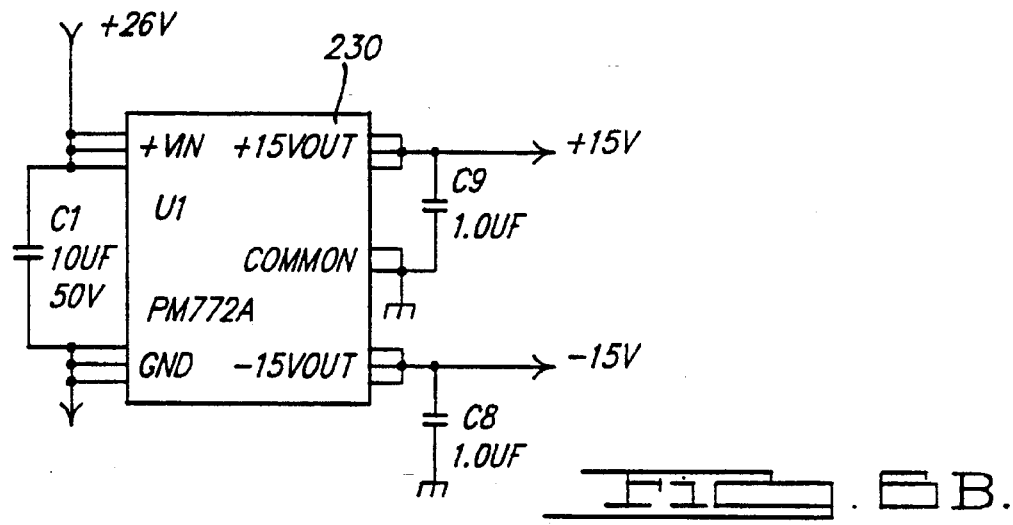
Figure 8E:
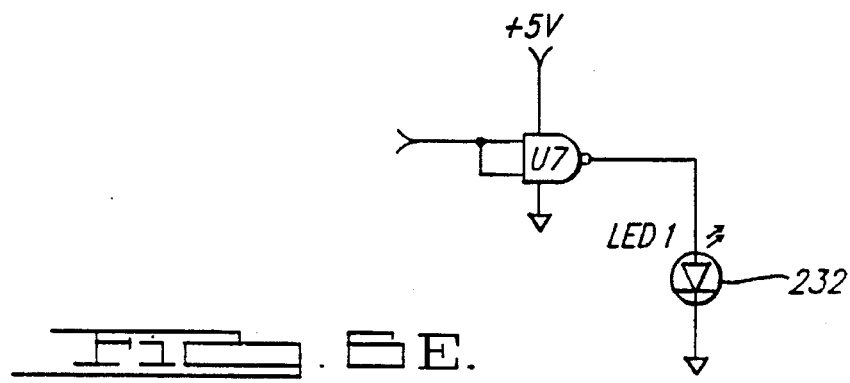
Figure 8F:
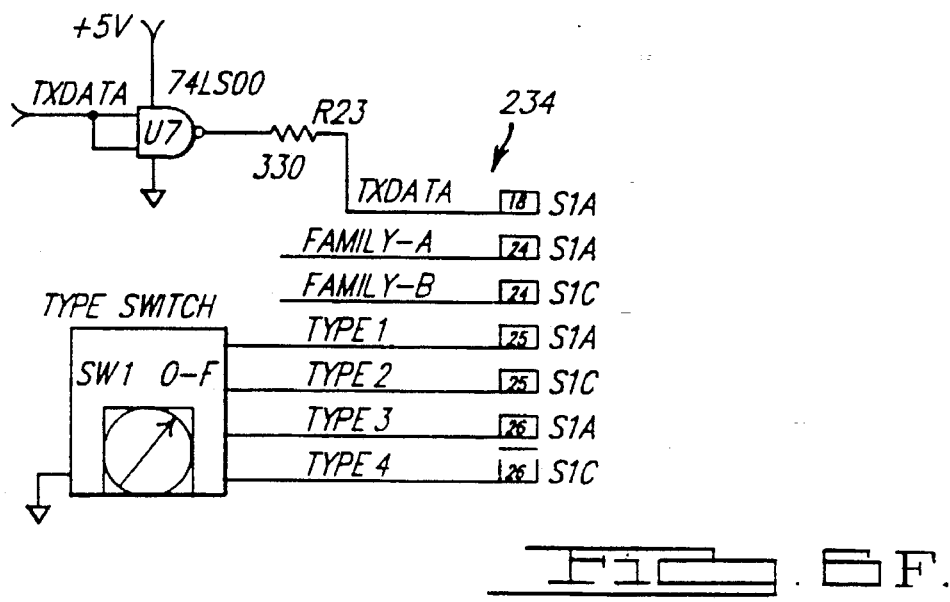

Referring now to FIG. 4B, a flowchart of the data read interrupt 92 is shown. Initially in step 94, the next interrupt is scheduled for t+834 microseconds, where t is the current time, to maintain the accuracy needed for precise phase measurements. It should be noted that this frequency yields a sample rate that is not a multiple of 60 hertz (i.e., 1199 samples/sec. as opposed to 1200 samples/sec.). Where the sinusoidal inputs to be measured are 60 hertz, it is an advantage of the present invention to sample at a different frequency rate. This is because if the sample rate was synchronous with the power waveform, the same points along the waveform would be measured from cycle to cycle. Consequently, spikes in the signal would be measured each time. In accordance with the present invention, the non-synchronous sampling rate causes the sampling to move across the wave form from cycle to cycle so that artifacts, such as spikes, are not measured each time. Step 94 then sets a "data to be processed" flag. This flag is then detected after the interrupt is complete, in decision diamond 88, shown in FIG. 4A. Next, step 96 will read and store the data presently in channels 1–5 40. This data may be stored in a raw read buffer in the associated memory of microprocessor 58, where it will be available for the data process routine 90. In this regard, it should be noted that data for a full cycle is stored (i.e., no data is thrown away) in this buffer. After a full cycle of data has been accumulated, it is sent to another buffer of the memory to permit averaging with a larger set of data. As discussed above, this data will be transmitted to the microprocessor 58 along bus 72 from the A to D converter 70. Next, the process determines if the "calibration read" flag has been set. That is, in step 84 shown in FIG. 4A the calibration read flag will be set after each host data request (e.g., once/second). If the calibration read flag is not set, decision diamond 98 proceeds back to the interrupt return 100 which directs the processing back to step 82 in FIG. 4A. If the calibration read flag has been set, step 102 is performed to clear the calibration read flag, read/store the precision voltage reference, and read/store the ground reference. In particular, the voltage reference signal on line 208 and the ground reference signal on line 209 are provided to the multiplexer 56 as shown in FIG. 6A in order to provide the data necessary for compensation/calibration of the multiplexer 56 and amplifier 66 due to environmental changes. The voltage and ground reference data are used during the data processing sub-routine 90 to be discussed presently. The process then returns to the main loop 78.

Figure 4C:
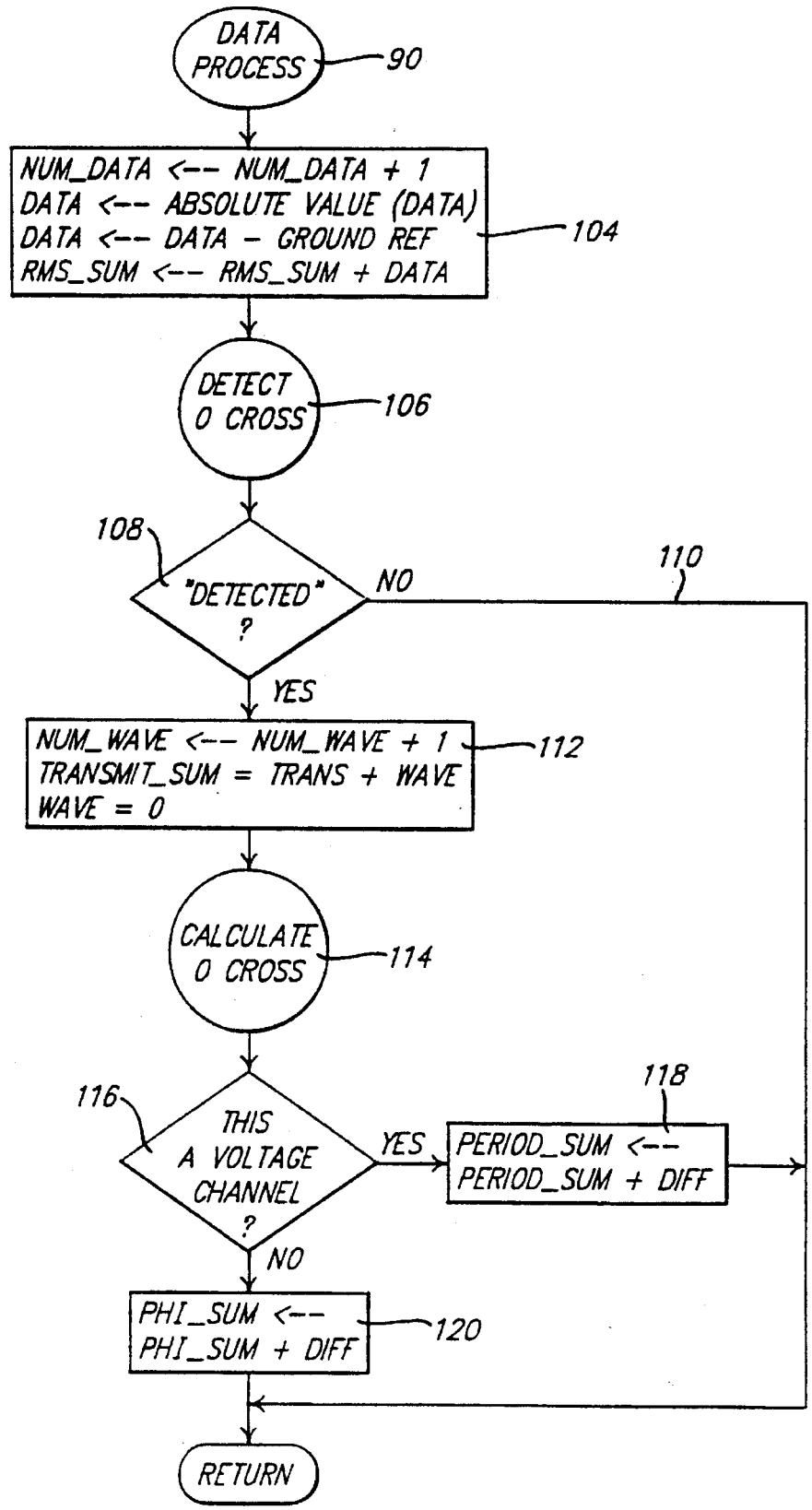

Referring now to FIG. 4C the data processing sub-routine 90 for one of the five channels begins with step 104, which initially indexes a data number by an increment of one over the previous data point that was read in the previous interrupt. Next, step 104 takes the absolute value of the data. Then, the DC offset (value of ground reference) is subtracted from the absolute value of each data point. This value is then added to the RMS sum. The RMS sum will be used to calculate average RMS, as discussed below in connection with FIG. 5B. Next, the process proceeds to the "detect" zero cross sub-routine 106, discussed below in connection with 4D. If a zero cross is not detected in sub-routine 106, decision diamond 108 will return along line 110 to the sine board main loop line 86 shown in FIG. 4A. If, on the other hand, decision diamond 108 determines that a zero cross has been detected, step 112 will index a number of waves of data associated with that sine wave by one, and proceed to the "calculate zero cross" sub-routine 114, shown in FIG. 4E. The number of the wave will be used in the frequency calculation, discussed below in connection with FIG. 5C. It should be noted that step 112 also updates the transmit sum buffer with the addition of another wave number, and the wave buffer is reset to zero. This is because the sine board computer 44 only sends completed wave information to the field computer 42. The sine board computer holds the data for incomplete waves until the next time data is requested by the field computer 42.

Decision diamond 116 next determines if the present channel is a voltage channel by the fact that it is the number one channel used in this application. If it is, step 118 calculates a period summation equal to the previous period sum plus the zero cross time difference (Diff.). "Diff" is calculated in the "calculate zero cross" sub-routine 114, as the time of the current zero cross, minus the time of the previous zero cross point. If decision diamond 116 determines that the present channel is not a voltage channel, then step 120 is performed which adds the "Diff" value to the phase angle PHI. The phase angle PHI is equal to the time between the zero cross of the current and the zero cross of the most recent voltage signal. After step 120, the data processing sub-routine 90 proceeds back to the sine board main loop 78.

Figure 4D:
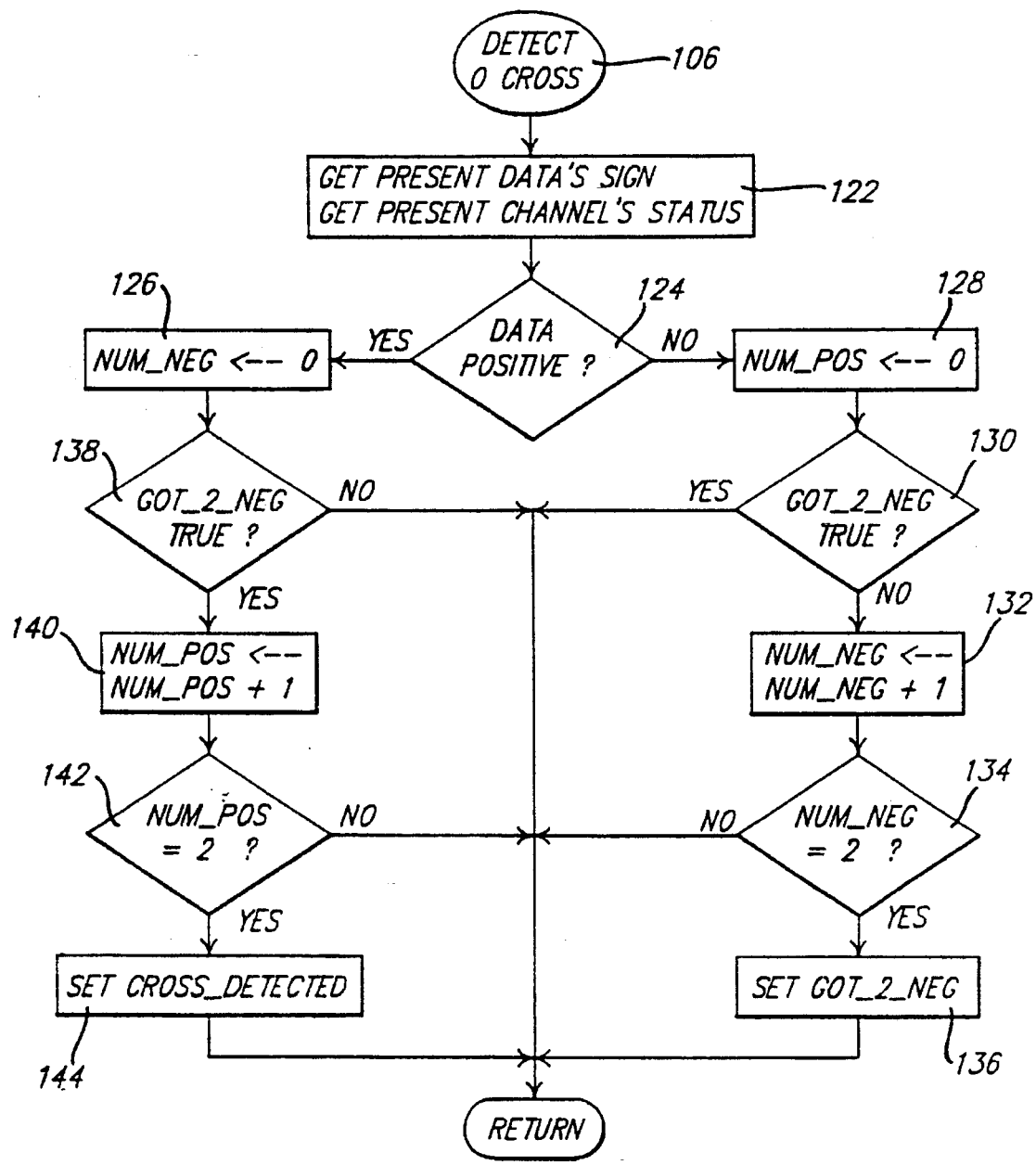

The detect zero cross sub-routine 106 is described in more detail on FIG. 4D. Initially, step 122 gets the present data's sign and the present channel's status. In general, the detect zero cross sub-routine 106 waits for a case when two positive data points have followed two negative data points. This condition will set the "cross detected" flag. In more detail, step 124 determines if the present data is positive. If it is, the number of negative data values ("Num Neg") is set to zero in step 126. If the data is negative, step 128 will set the number of positive data points ("Num Pos") to zero. Next, decision diamond 130 checks to see if the "got 2 neg" flag is set. This will have occurred through a previous iteration through the steps to be described below. If the "got 2 neg" flag is not set, step 132 will index the number of negative points ("Num Neg") by one, and step 134 will determine if the number of negative points is equal to two. If it is, step 136 will set the "got 2 neg" flag, and the detect zero cross sub-routine will return to the data processing routine 90 described or shown on FIG. 4C. Likewise, if step 130 determines that the "got 2 neg" flag was set, or if step 134 determines that the number of negative data points was not equal to 2, the process would return back to the data processing sub-routine 90.

Where the decision diamond 124 determines that the data was positive, after step 126 sets the num neg to zero, decision diamond 138 will determine if the "got 2 neg" flag has been set by a previous iteration of step 136. If not, the process returns to the data processing sub-routine 90. If it has been set, step 140 will index the number of positive data points by one and step 142 will determine if this number is two. If it is not, step 142 will direct the process back to the data processing sub-routine 90. If the number is two, on the other hand step 144 will set the "cross detected" flag indicating that two positive data points have followed two negative data points.

Figure 3A:
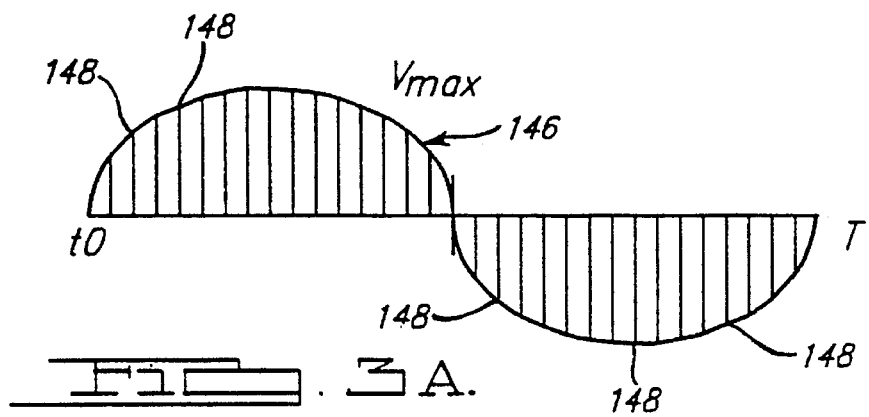
FIG. 3A–3B provide an illustration of representative sine waves showing the measurement techniques in accordance with the present invention.
Figure 3B:
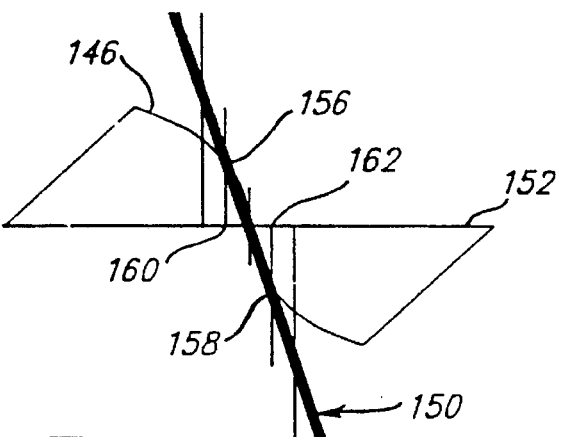
Figure 4E:
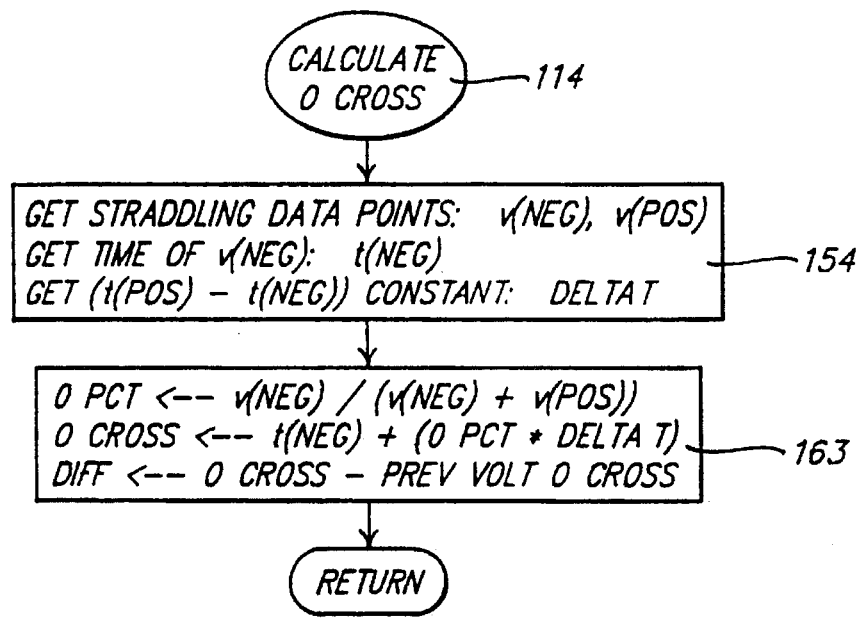

The calculate zero cross sub-routine 114 is shown on FIG. 4E. In general, this sub-routine uses a straight line approximation Y=Mx+B between the pair of data points that straddle the zero line to approximate the cross over point for the sine wave. This process is illustrated in FIG. 3A where the sine wave 146 is shown divided up by vertical lines intersecting the sine wave 146 at data points 148 which are taken every 834 micro seconds. The zero cross point is found as shown in FIG. 3B by drawing a straight line 150 between a pair of data points that straddle the zero line. The point at which line 150 crosses the zero line 152 is the approximate zero cross point. While FIG. 3B illustrates zero crossing detection on the positive to negative transition, it will be apparent from the description below that the detection may also take place in the negative to positive transition.

Referring again to FIG. 4E, the calculate zero cross sub-routine 114 begins with step 154 to initially find the straddling data points; that is, the negative voltage and the positive voltage on either side of the zero crossing point. This may be, for example, point 156 and 158 shown on FIG. 3B. Next, step 154 determines the time of the negative and positive points shown at 160 and 162, respectively, on FIG. 3B. Next, step 154 gets the known time difference between point 162 and 160, or delta t. Next, in step 163 the voltage of the negative point 158 is divided by the voltage of the negative point plus the voltage of the positive point 156 to calculate the slope. The zero cross is then set to be equal to the time of the negative point 162 plus the zero point crossing time plus a percentage of the delta t that has occurred. Next, step 163 calculates the difference between the zero cross just calculated and the previous voltage zero cross. The calculate zero cross sub-routine then proceeds back to the data process sub-routine 90 where the difference (Diff) is used in subsequent steps 118 and 120.

Figure 5A:
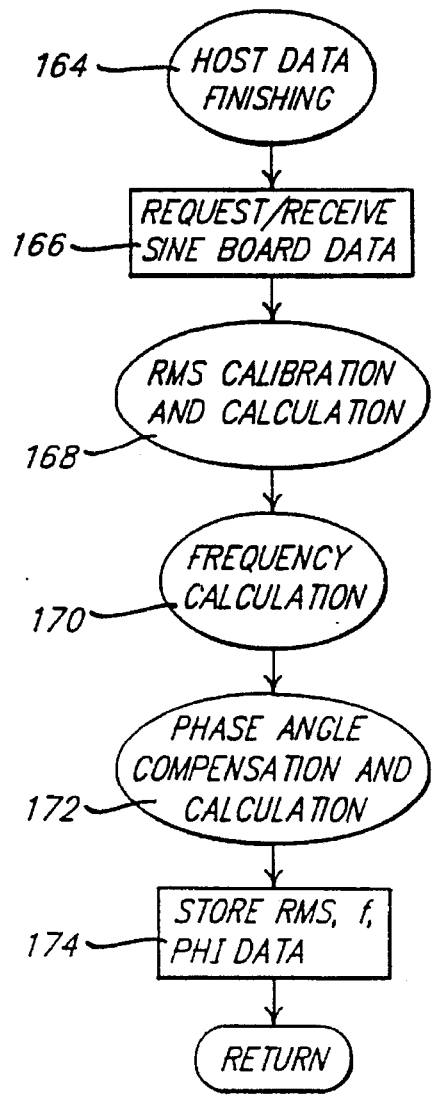
FIGS. 5A–5D comprise flowcharts the processing of the host computer in accordance with the present invention.
Figure 5B:
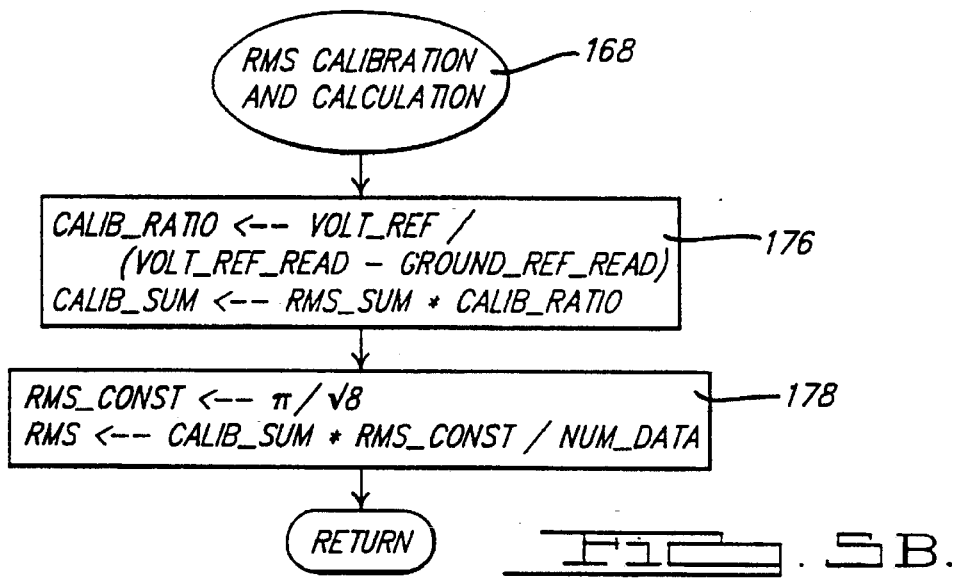
Figure 5C:
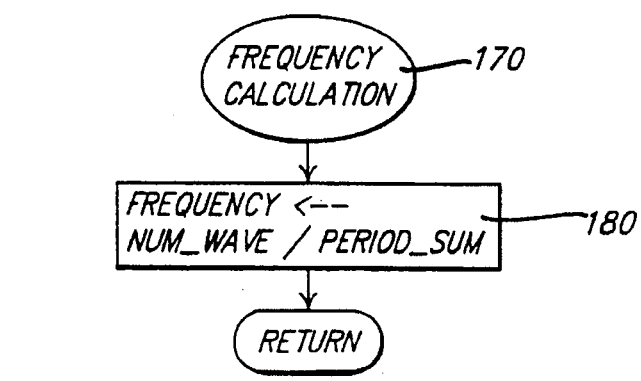

The data finishing functions are performed by the field computer 42. A flowchart of the data finishing process 164 is shown in FIG. 5A. Initially, in step 166 the host processor requests and receives the data received and processed in the steps discussed above in connection with FIGS. 4A–4e from the sine board computer 44. Step 166 is preferably performed once per second, and corresponds to a host data request step 82 in FIG. 4A. Next, an RMS calibration and calculation sub-routine 168 is performed. Then, a frequency calculation sub-routine 170 and a phase angle compensation calculation sub-routine 172 have performed. Finally, step 174 stores the RMS, frequency and phase angle data.

In more detail, the RMS calibration and calculation sub-routine 168 for each of the five channels is shown on FIG.

5B. In general the RMS calibration and calculation subroutine 168 calibrates the RMS sum by multiplication with a gain calibration ratio, which is a calibration for any analog/gain error associated with the multiplexer and amplifier circuits. If the analog/gain error is more than 10 percent, then a calibration error is reported by the host computer 42 and the sine board computer 44 waits for a reset signal from the host computer 42 to continue operations. Thus, in this embodiment, the host computer 42 is programmed to see whether the reference voltage signal being read is within plus or minus 10 percent of its known value. If the reference voltage is within tolerance, then the RMS answers are adjusted to compensate for the error characterized by the calibration ratio in step 176. In particular, step 176 first determines the calibration ratio as the voltage reference divided by the voltage reference read minus the ground reference read. Next, step 176 multiplies the calibration ratio by the RMS sum which was determined above in step 104 for each of the voltage and current signals being sampled. This yields the calibrated RMS sum. Next, step 178 calculates an RMS constant which is pi divided by the square root of 8 and the calibrated average RMS is then determined by multiplying the calibrated sum by the RMS constant divided by the total number of samples. Sub-routine 168 then returns to the host data finishing process 164 which proceeds to the frequency calculation sub-routine 170 shown on FIG. 5C.

Figure 5D:
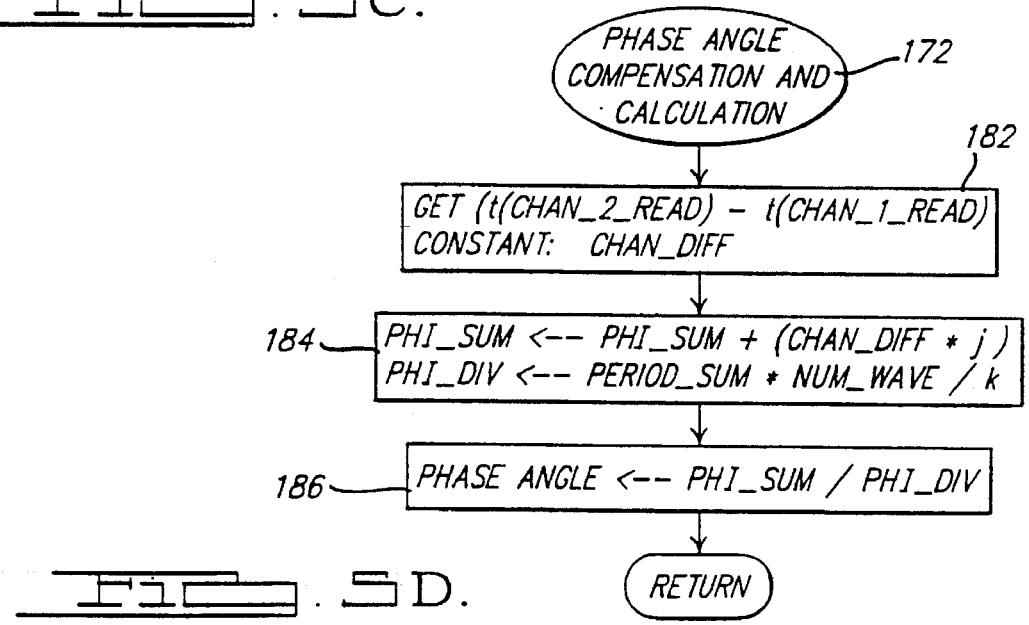

The frequency calculation sub-routine 170 calculates the average frequency by inverting the period sum divided by the total number of voltage waves received. That is, step 180 divides the total number of waves received by the period sum to determine the frequency. It will be appreciated that the period sum was determined in step 118 in the flowchart on FIG. 4C and the number of waves was determined in step 112 on FIG. 4C. Next, the frequency calculation sub-routine 170 proceeds back to the data finishing process 164 which directs the process to the phase angle compensation and calculation sub-routine 172 shown on FIG. 5D for each of the four current channels. This sub-routine is used to convert the time domain phase information received from the sine board computer 44 into phase angle degrees. In this regard, the sub-routine calculates a compensated PHI sum by addition with the time between channel reads constant. This provides compensation for the fact that the channels are sampled at deterministically different times. In particular, step 182 defines the channel diff constant as the time between the channel two read minus the time between the channel one read. Next, step 184 calculates the PHI sum as the PHI sum (calculated in step 120) plus the channel diff constant times j where j is defined as the channel number minus one. Thus, it should be appreciated that j indexes from one to four as the program advances through the current signal channels. Next, step 184 calculates the PHI divisor as the period sum (found in step 118) multiplied by the number of waves divided by k, where k is proportional to the full scale of the A to D converter and the full scale of finished values of the parameters being monitored. The period is needed at this juncture, because the invention may be employed with power systems using different frequencies (e.g., 50 or 60 hertz). Next, step 186 determines the average phase angle as the compensated PHI sum divided by the PHI divisor. Sub-routine 172 then proceeds back to the host data finishing process and the RMS, frequency and phi data are stored in step 174. These stored parameters are then available to a central control computer 50, shown in FIG. 1, by means of bus 46, in communication with the communication network 48. It will be appreciated that from these fundamental parameters (RMS volts/amps frequency and phase data) the central control computer 50 can derive useful system parameters such as watts, watt-hours, VARS, power factor, etc.

Figure 6C:
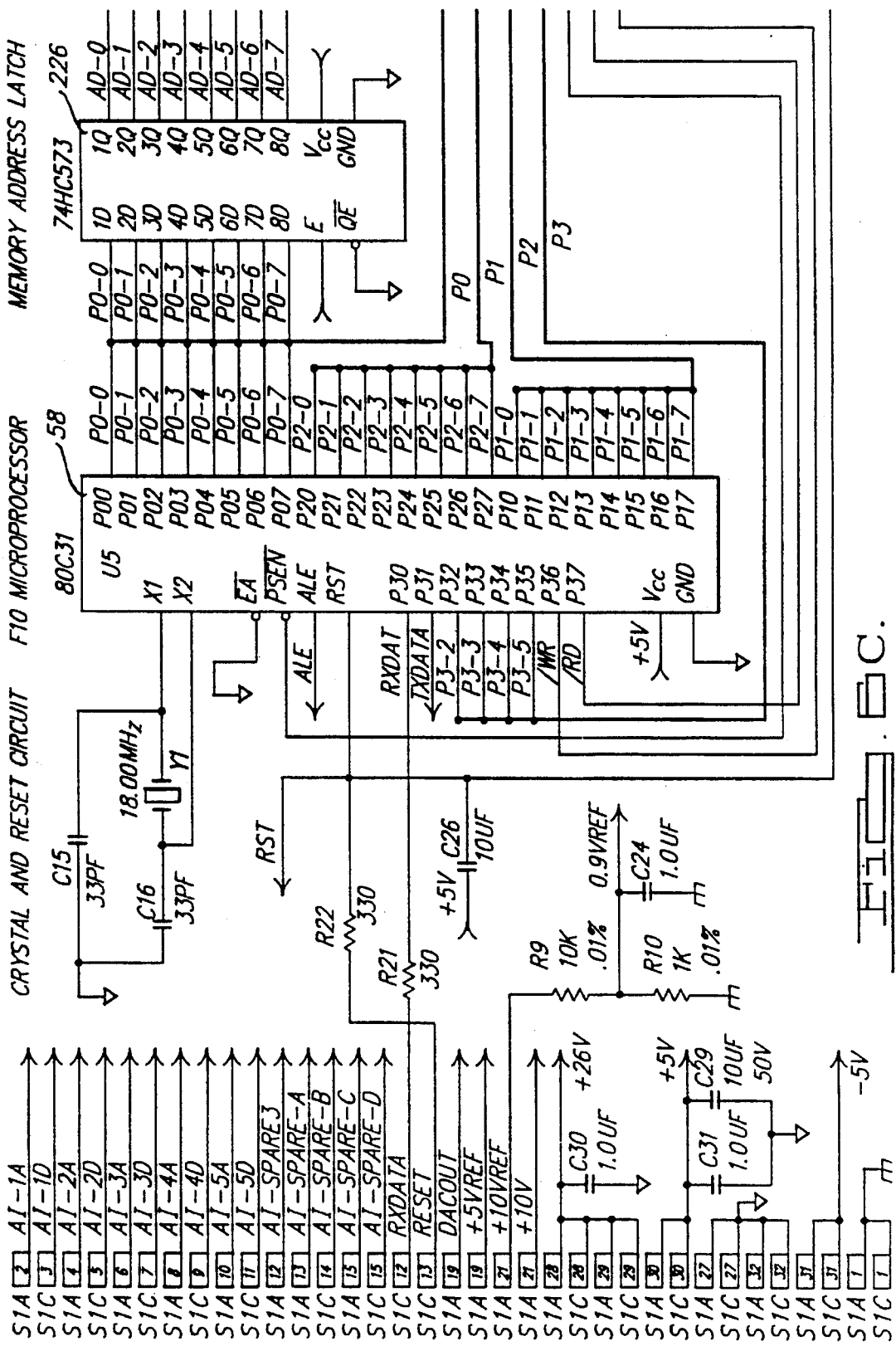

Referring now to FIGS. 6A–6F, a schematic view of a preferred embodiment of the sine board computer 44 is shown. The channel one inputs 188 and 190 comprise the negative and positive inputs from the potential transformer 12 respectively. Likewise the channel 2, 3, 4 and 5 inputs comprise the negative 191, 194, 198, 202, and positive 192, 196, 198, 200, 204 inputs from the four current transformers 14, 18, 20 and 22. Each input channel includes a pair of resistors 203 and 205 and a capacitor 206 which together serve to filter out noise and resist surges of the incoming analog input signals. The channel 1–5 inputs are fed to the input lines in the multiplex device 56, which is provided with a 0.909 voltage reference 208, plus and minus 15 volt supply 210 and 212, respectively, while the ground pin as well as pins 6a, 7a, 8a, 6b, 7b, 8b are grounded. Address lines 60 as well as mux enable line 214 are supplied from latch 216 shown on FIG. 6D. Latch 216 may be a 74HC374, which is coupled to the micro processor 58 shown on FIG. 6C for controlling the multiplex device 56. The multiplex device 56 provides two outputs 218 and 220, comprising the plus and minus signals respectively. Output signals 218 and 220 are fed to a differential amplifier circuit 66. It will be appreciated that differential amplifier circuit 66 takes a difference between the voltages on lines 218 and 220, amplifies this difference by ten, and transmits this amplified difference as a single sinusoidally varying voltage level to line 68 which is then fed to the A to D converter 70 input. The 12 bit digital output of A to D converter 70 is transmitted along bus 72 to the microprocessor 58 inputs. The microprocessor circuit controls the A to D converter by means of the CTC line 76 shown in FIG. 6A and 6D. FIG. 6B shows the memory and I/O controller PLD which decodes and provides strobe signals as well as memory circuits 222, 224, 226 used for program memory. FIG. 6C illustrates the memory address latch 226 and FIG. 6D shows the memory and I/O controller 228 for controlling interaction between the microprocessor 58 and the program memory as well as A to D converter by means of the CTC command signal. FIG. 6B shows the power supply 230. FIG. 6E shows a diagnostic light emitting diode 232 which is tied to the reset line driven by the field computer to indicate whether the sine board computer 44 is functioning properly. FIG. 6F shows the connector 254 for transmitting data to the field computer 42. It will be appreciated that the high speed power analyzer system 10 described above provides a rapid measurement of power circuit parameters that is independent of frequency and voltage. It also provides uninterrupted continuous sampling of five input channels at 1199 hertz at each channel and automatically performs calibration, and compensation continuously.

The various embodiments which have been set forth above were for the purpose of illustration and were not intended to limit the invention. It will be appreciated by those skilled in the art that various changes and modifications may be made to these embodiments described in this specification without departing from the spirit and scope of the invention as defined by the appended claims.

We claim:

1. A high speed power analyzer for measuring electrical parameters in an alternating waveform power system, comprising:

input means for receiving a plurality of analog input signals which represent electrical parameters of the power system, where at least one of said analog input signals represents a voltage signal and another of said analog input signals represents a current signal;

multiplexer means connected to said input means for sampling each of said analog input signals by individually transmitting selected ones of said analog input signals;

converter means, connected to said multiplexer means, for converting sampled analog input signals received from said multiplexer means into a digital representation of said analog input signals; and processor circuit means, coupled to said multiplexer means and said converter means, for controlling the sampling of said analog input signals by said multiplexer means in accordance with a predetermined sampling schedule which is nonsynchronous with the waveform of said power system, and for processing said digital representations of said analog input signals received from said converter means to produce a plurality of output signals which are indicative of predetermined electrical variables related to the power being used in said power systems wherein said predetermined variables include the phase difference between said voltage and current signals, the frequency of said voltage signal, and the RMS values of each of said analog input signals.

2. The invention according to claim 1, wherein said analog input signals vary sinusoidally an a given frequency, and said analog input signals include at least one voltage signal and a plurality of current signals.

3. The invention according to claim 2, wherein said predetermined sampling schedule requires that each of said analog input signals be sampled over 1000 times per second.

4. The invention according to claim 3, wherein the sampling frequency of said predetermined sampling schedule is not a multiple of the given frequency of said analog input signals.

5. A high speed power analyzer for measuring electrical parameters in an alternating waveform power system, comprising:

input means for receiving a plurality of analog input signals which represent electrical parameters of the power system, where at least one of said analog input signals represents a voltage signal and another of said analog input signals represents a current signal;

multiplexer means connected to said input means for sampling each of said analog input signals by individually transmitting selected ones of said analog input signals;

converter means, connected to said multiplexer means, for converting sampled analog input signals received from said multiplexer means into a digital representation of said analog input signals; and processor circuit means, coupled to said multiplexer means and said converter means, for controlling the sampling of said analog input signals by said multiplexer means in accordance with a predetermined sampling schedule, and for processing said digital representations of said analog input signals received from said converter means to produce a plurality of output signals which are indicative of predetermined electrical variables related to the power being used in said power system, said processor circuit means including means for determining a zero crossing time in the waveform of at least two of said analog input signals by first detecting that a predetermined number of sampled data points of one numeric sign for an analog input signal have followed a predetermined number of sampled data points of the opposite numeric sign for said analog input signal, and then determining said zero crossing time from a linear extrapolation between the two sampled data points closest to the zero crossing of said analog input signal.

6. The invention according to claim 5, wherein said one numeric sign is positive and said other numeric sign is negative.

7. The invention according to claim 5, wherein said predetermined number of sampled data points for both of said numeric signs is two.

8. A high speed power analyzer for measuring electrical parameters in an alternating waveform power system, comprising:

input means for receiving a plurality of reference signals and a plurality of analog input signals which represent electrical parameters of the power system, where at least one of said analog input signals represents a voltage signal and another of said analog input signals represents a current signal;

multiplexer means connected to said input means for sampling each of said analog input signals by individually transmitting selected ones of said analog input signals;

amplifier means, connected to said multiplexer means, for amplifying the magnitude of sampled analog input signals received from said multiplexer means;

converter means, connected to said amplifier means, for converting sampled analog input signals received from said amplifier means into a digital representation of said analog input signals; and processor circuit means, coupled to said multiplexer means and said converter means, for controlling the sampling of said reference signals and said analog input signals by said multiplexer means in accordance with a predetermined sampling schedule, and for processing said digital representation of said analog input signals received from said converter means to produce a plurality of output signals which are indicative of predetermined electrical variables related to the power being used in said power system, said processor circuit means including means for calibrating the conversion coefficients of said converter means by sampling said reference signals in accordance with said predetermined sampling schedule, adjusting said conversion coefficients when said adjustments are within a predetermined limit, and generating an error signal when said adjustments exceed said predetermined limit.

9. The invention according to claim 8, wherein said reference signals are sampled at least once per second.

10. The invention according to claim 5, wherein said predetermined sampling schedule is nonsynchronous with the waveform of said power system.

11. The invention according to claim 8, wherein said predetermined sampling schedule is nonsynchronous with the waveform of said power system.

12. The invention according to claim 11 wherein said processor circuit means includes means for determining a zero crossing time in the waveform of at least two of said analog input signals by first detecting that a predetermined number of sampled data points of one numeric sign for an analog input signal have followed a predetermined number of sampled data points of the opposite numeric sign for said analog input signal, and then determining said zero crossing time from a linear extrapolation between the two sampled data points closest to the zero crossing of said analog input signal.

13. The invention according to claim 8, wherein said processor circuit means includes means for determining a zero crossing time in the waveform of at least two of said analog input signals by first detecting that a predetermined number of sampled data points of one numeric sign for an analog input signal have followed a predetermined number of sampled data points of the opposite numeric sign for said analog input signal, and then determining said zero crossing time from a linear extrapolation between the two sampled data points closest to the zero crossing of said analog input signal.

14. The invention according to claim 9, wherein said predetermined sampling schedule requires that each of said analog input signals be sampled over 1000 times per second.

15. The invention according to claim 1, wherein said processor circuit means includes means for compensating for the difference between the times that said analog input signals are sampled.

16. The invention according to claim 5, wherein said processor circuit means includes means for compensating for the difference between the times that said analog input signals are sampled.

17. The invention according to claim 8, wherein said processor circuit means includes means for compensating for the difference between the times that said analog input signals are sampled.

18. A method of measuring electrical parameters in an alternating waveform power system, comprising the steps of:

receiving a plurality of analog input signals which represent electrical parameters of the power system, where at least one of said analog input signals represents a voltage signal and another of said analog input signals represents a current signal;

sampling each of said analog input signals in accordance with a predetermined sampling schedule which is nonsynchronous with the waveform of said power system;

converting said sampled analog input signals into a digital representation of said analog input signals; and producing a plurality of output signals which are indicative of predetermined electrical variables related to the power being used in said power system.

19. The invention according to claim 18, further including the step of determining a zero crossing time in the waveform of at least two of said analog input signals.

20. The invention according to claim 19, wherein said zero crossing time is determined by first detecting that a predetermined number of sampled data points of one numeric sign for an analog input signal have followed a predetermined number of sampled data points of the opposite numeric sign for said analog input signal, and then performing a linear extrapolation between the two sampled data points closest to the zero crossing of said analog input signal.

21. The invention according to claim 18, further including the steps of periodically sampling a plurality of reference signals, calibrating the coefficients used during said analog to digital conversion step from the measurement of said reference signals, adjusting said conversion coefficients when said adjustments are within a predetermined limit, and generating an error signal when said adjustments exceed said predetermined limit.

22. The invention according to claim 18, further including the steps of sampling said analog input signals at different times, and compensating for the difference in times that said analog signals are sampled.

23. The invention according to claim 18, wherein said predetermined variables include the phase difference between said voltage and current signals, the frequency of said voltage, and the RMS values of each of said analog input signals.

24. A method of measuring electrical parameters in an alternating waveform power system, comprising the steps of:

receiving a plurality of analog input signals which represent electrical parameters of the power system, where at least one of said analog input signals represents a voltage signal and another of said analog input signals represents a current signal;

sampling each of said analog input signals in accordance with a predetermined sampling schedule, said analog input signals being sampled at different times;

converting said sampled analog input signals into a digital representation of said analog input signals;

compensating for the difference in times that said analog signals are sampled; and producing a plurality of output signals which are indicative of predetermined electrical variables related to the power being used in said power system.

25. The invention according to claim 24, wherein said predetermined variables include the phase difference between said voltage and current signals, the frequency of said voltage, and the RMS values of each of said analog input signals.

26. A method of measuring electrical parameters in an alternating waveform power system, comprising the steps of:

receiving a plurality of analog input signals which represent electrical parameters of the power system, where at least one of said analog input signals represents a voltage signal and another of said analog input signals represents a current signal;

sampling each of said analog input signals in accordance with a predetermined sampling schedule;

converting said sampled analog input signals into a digital representation of said analog input signals;

determining a zero crossing time in the waveform of at least two of said analog input signals by first detecting that a predetermined number of sampled data points of one numeric sign for an analog input signal have followed a predetermined number of sampled data points of the opposite numeric sign for said analog input signal, and then performing a linear extrapolation between the two sampled data points closest to the zero crossing of said analog input signal; and producing a plurality of output signals which are indicative of predetermined electrical variables related to the power being used in said power system.

27. The invention according to claim 26, wherein said predetermined variables include the phase difference between said voltage and current signals, the frequency of said voltage, and the RMS values of each of said analog input signals.

28. A method of measuring electrical parameters in an alternating waveform power system, comprising the steps of:

receiving a plurality of analog input signals which represent electrical parameters of the power system, where at least one of said analog input signals represents a voltage signal and another of said analog input signals represents a current signal;

sampling each of said analog input signals in accordance with a predetermined sampling schedule;

converting said sampled analog input signals into a digital representation of said analog input signals;

periodically sampling a plurality of reference signals, calibrating the coefficients used during said analog to digital conversion step from the measurement of said reference signals, adjusting said conversion coefficients when said adjustments are within a predetermined limit, and generating an error signal when said adjustments exceed said predetermined limit; and producing a plurality of output signals which are indicative of predetermined electrical variables related to the power being used in said power system.

29. The invention according to claim 28, wherein said predetermined variables include the phase difference between said voltage and current signals, the frequency of said voltage, and the RMS values of each of said analog input signals.

* * * * *